United States Patent [19]

Piotrowski et al.

[11] Patent Number: 4,499,515

[45] Date of Patent: Feb. 12, 1985

[54] INTEGRATED MAGNETOSTRICTIVE-PIEZORESISTIVE MAGNETIC RECORDING PLAYBACK HEAD

[75] Inventors: Chester Piotrowski, White Bear Lake; Neil W. Loeding, Mounds View; Raymond M. Warner, Jr., Edina, All of Minn.

[73] Assignee: Minnesota Mining and Manufacturing Company, St. Paul, Minn.

[21] Appl. No.: 398,419

[22] Filed: Jul. 14, 1982

[51] Int. Cl.³ .......................... G11B 5/12; G11B 5/30
[52] U.S. Cl. .................................................... 360/113
[58] Field of Search ............................. 360/113, 125; 364/157–158

[56] References Cited

U.S. PATENT DOCUMENTS

| | | | |
|---|---|---|---|
| 3,344,237 | 9/1967 | Gregg | 179/100.2 |
| 3,908,194 | 9/1975 | Romankiw | 360/113 |
| 3,909,809 | 9/1975 | Kinsner et al. | 360/113 X |
| 3,987,485 | 10/1976 | Sugaya et al. | 360/63 |
| 4,129,880 | 12/1978 | Vinal | 357/27 |

OTHER PUBLICATIONS

IBM/TDB, vol. 21, No. 2, Jul. 1978, pp. 667–668, Magnetic Read/Write Thin Film Head ... by Brunsch et al.
IBM/TDB, vol. 17, No. 12, May 1975, pp. 3751–3752, "Scanned MR Sensors", by Lean et al.
Int. J. Electronics, 1981, vol. 51, No. 3, pp. 255–263–"A Broadband Magneto-Electric Transducer ...", by Bracke et al.

Primary Examiner—John H. Wolff
Attorney, Agent, or Firm—Donald M. Sell; James A. Smith; William B. Barte

[57] ABSTRACT

A thin film magnetic recording playback head is disclosed wherein mechanically coupled films of a magnetostrictive material and of a piezoresistive material are utilized with a solid state amplifier electrically coupled to sense resistance changes in the piezoresistive film. In operation, localized magnetic patterns on a recording medium induce strain in the magnetostrictive film, which in turn induces in the piezoresistive film corresponding changes in electrical resistance.

21 Claims, 14 Drawing Figures

INTEGRATED MAGNETOSTRICTIVE-PIEZORESISTIVE MAGNETIC RECORDING PLAYBACK HEAD

FIELD OF THE INVENTION

This invention relates to magnetic recording playback heads, particularly to such heads wherein non-inductive means are utilized for sensing localized magnetic field patterns of a magnetic recording medium.

DESCRIPTION OF THE PRIOR ART

With an apparently never-ending quest to increase the storage density on magnetic recording media have come increased demands not only on the magnetic recording media per se, but also on the transducers used for both recording and playing back the recorded information. As the recorded bit size has progressively decreased, the recording and playback head gaps in typical ring shaped heads have also decreased until it is now virtually impossible to reduce them further using discrete spacer layers. These has consequently been developed a new class of recording and playback heads utilizing thin films, in which high permeability materials are formed as thin film pole pieces, metallic thin films are formed to provide inductive windings around the thin film pole pieces, and insulative thin films are formed to provide both a gap between the pole pieces and to insulate the respective windings where appropriate.

Such thin film heads were perhaps first disclosed in U.S. Pat. No. 3,344,237 assigned to Minnesota Mining and Manufacturing Company, the assignee of the present invention. Since that initial development, many types of thin film heads have been developed in various attempts to improve the reliability and signal-to-noise ratio while reducing manufacturing costs, complexity, and the like. Relevant to the present invention are non-inductive thin film playback heads, such as those utilizing magnetoresistive films. U.S. Pat. No. 3,987,485 (Sugaya et al) is exemplary of prior art disclosing such heads. The device there disclosed includes a semiconductive substrate on which may be deposited, along with the magnetoresistive film, or films for multitrack heads, integrated circuits such as switching circuits and amplifiers which are connected to the magnetic heads. In a somewhat similar fashion, U.S. Pat. No. 3,908,194 (Romankiw) depicts a thin film magnetoresistive read head integrated with a thin film inductive write head.

In addition to such magnetoresistive thin film heads, it is also known to utilize heads including thin films having magnetostrictive properties. Thus, for example, Brunsch et al, IBM Tech. Disclosure Bulletin, Vol. 21, No. 2, July 1978, pp. 667–668, depicts a thin film head, with both read and write capabilities, in which magnetostrictive films having permanent anisotropy surround a single turn inductive winding, forming a working gap therebetween, and are in turn mechanically coupled to a piezoelectric substrate. In the head there depicted, read or write signals appear to be coupled from or to the conductor and hence inductively from or to the gap, while DC or AC voltages are applied to the piezoelectric substrate, causing stress in the magnetostrictive films, which, in turn, rotates the anisotropy to allow the signals to be more readily coupled through the gap. Such a head is thus actually an inductive type device in which magnetostriction is utilized in a secondary manner.

A device in which mechanically coupled magnetostrictive and piezoelectric films are used to directly sense localized fields is depicted in U.S. Pat. No. 3,909,809 (Kinsner et al). The device there set forth is adapted for sensing magnetic bubble domains such as may be present in magnetic bubble memories in which the bubble memory and sensing device are both stationary, i.e. one does not move relative to the other, as is otherwise the case in a magnetic recording medium and associated record or playback head. Further, the device disclosed therein does not incorporate amplifiers or other electronic circuits as an integral part thereof.

DISCLOSURE OF INVENTION

In contrast to thin film magnetoresistive playback heads and magnetic field sensors such as discussed above, the magnetic sensor of the present invention comprises at least one magnetostrictive stratum mechanically coupled to a piezoresistive stratum. Strain magnetically induced in the magnetostrictive stratum is coupled to the piezoresistive stratum to produce therein a corresponding change in the electrical resistivity thereof. Localized magnetic field patterns such as may be present in a record track in a magnetic recording medium positioned adjacent the magnetostrictive stratum may thereby be sensed independently of speed, or changes in the speed, of the head relative to the medium.

The sensor further comprises means for sensing the change in resistivity and for providing an electrical output signal in response thereto which is representative of the intensity of magnetic field impressed upon the magnetostrictive stratum.

In a preferred embodiment, the sensor of the present invention comprises a substrate having appreciable piezoresistive characteristics and wherein the magnetostrictive stratum overlies the substrate. Preferably, the sensing means comprises a solid state amplifier formed as a single integrated structure together with the piezoresistive stratum. Such an amplifier desirably includes a piezoresistively responsive region to which the magnetostrictive stratum is mechanically coupled.

Desirably, a piezoresistive substrate having a magnetostrictive thin film thereon is fabricated together with a carrier member adapted to be mounted with the plane of the thin film substantially normal to the surface of a magnetic recording medium, thereby enabling localized magnetic patterns in the medium and oriented normal to the surface thereof to be impressed upon the length of the magnetostrictive thin film, thus producing a lengthwise strain which is coupled to the piezoresistive substrate.

If desired, the mechanically coupled magnetostrictive and piezoresistive strata may be positioned proximate to high permeability thin film pole pieces configured to optimize detection of either vertically or longitudinally oriented magnetic media such that magnetic fields coupled to the pole-pieces induce in the magnetostrictive stratum a mechanical strain which is coupled to the piezoresistive stratum as described hereinabove.

Also, in order to minimize interference from undesired stimuli, a further embodiment of the present invention includes an additional stratum of a non-strain sensitive material which has substantially the same area as that of the magnetostrictive stratum and which extends over a different portion of the piezoresistive stratum. In such embodiments, a change in the resistance in the piezoresistive stratum proximate the non-strain-sensitive stratum is compared with the change in resistance in another section of the piezoresistive stratum proximate the magnetostrictive stratum so that undesired non-magnetic stimuli, both time varying and steady state, applied to both portions of the piezoresistive stratum may be suppressed while allowing stimuli present only in one portion, such as that magnetically induced in the magnetostrictive stratum, to be readily detected.

When the sensor of the present invention is adapted for use as a magnetic recording playback head, it satisfies an existing need for a device for reading high density magnetic information stored in advanced memory systems.

DETAILED DESCRIPTION

Figure 1:
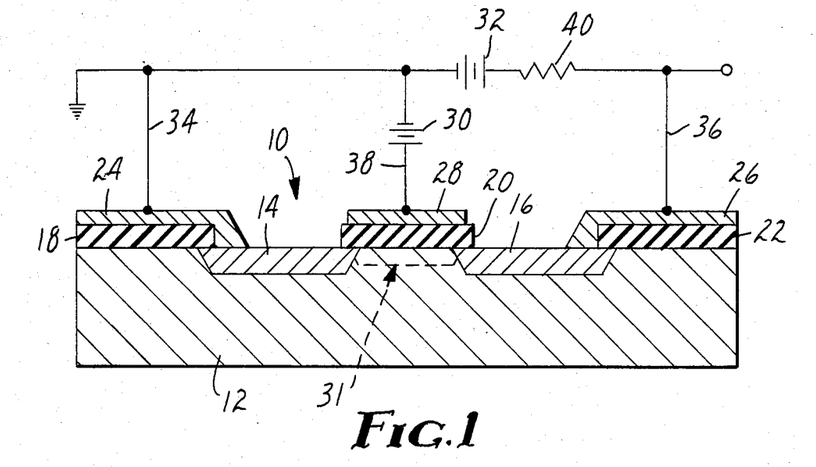
FIG. 1 is a sectional view of a preferred embodiment of a device according to the present invention wherein a magnetostrictive stratum is applied directly to the gate of an N-channel MOSFET transistor having a piezoresistive region proximate the gate.

As set forth herein, the device of the present invention may be constructed in a variety of configurations including embodiments wherein the magnetostrictive and piezoresistive strata are applied on separate substrates from that of an associated amplifier, as well as embodiments wherein the elements are directly coupled together. FIG. 1 sets forth a preferred embodiment of the latter wherein a magnetostrictive film is deposited over a piezoresistively responsive region associated with the gate area of a MOSFET transistor.

In order to better understand the operation of such an embodiment, a short description of the operation of a conventional MOSFET device will be useful. When a potential of suitable magnitude and polarity is applied to a gate electrode a conductive channel is formed between the source and drain regions. Application of a potential between those regions results in a current flow in the channel connecting those regions, the magnitude of which is determined by the polarity and magnitude of the applied potential.

Accordingly, as shown in FIG. 1, the device 10 includes a substrate 12 of P-type silicon in which two zones have been heavily doped to provide N-type regions 14 and 16, respectively. On top of the substrate and adjoining the N-type regions 14 and 16 are formed insulating $SiO_2$ regions 18, 20, and 22, respectively, and on top of the regions 18 and 22 are deposited metallic contact regions 24 and 26 respectively. In lieu of a conventional metallic electrode on top of the oxide region 20, a metallic magnetostrictive film 28 is then deposited, thus completing a modified MOSFET transistor. As the Si substrate, particularly in channel area 30, is appropriately strain sensitive, i.e. having appreciable piezoresistive characteristics, strain induced in the magnetostrictive film 28 from external magnetic fields and coupled through the underlying oxide layer 20 to the strain sensitive region 30, causes a change in the resistance in this region, so as to alter the current flow between the source and drain electrodes 24 and 26. Appropriate bias potentials such as provided by sources 30 and 32 may be applied to the device via conductors 34, 36, and 38 secured to the contacts 24, 26, and 28, respectively, and an output signal developed across resistor 40.

A device such as that set forth in FIG. 1 was constructed in the following manner. A P-channel enchancement mode MOSFET transistor was fabricated from an N-type silicon substrate utilizing conventional MOSFET technology, wherein the gate electrode was prepared having dimensions of approximately 25 by 1,000 micrometers. A magnetostrictive thin film approximately 500 nanometers thick was ion beam sputtered onto the gate electrode from a 98%+ pure nickel foil target. Alternatively, other magnetostrictive thin films may also be deposited, such as an alloy of approximately $Fe_{70}Si_{30}$.

Equivalent devices to that shown in FIG. 1 may be made using either N-channel or P-channel silicon substrates, operating in either an enhancement or depletion mode. Also, analogous devices may be constructed using bipolar transistors.

In the embodiment discussed hereinabove with respect to FIG. 2, the device was formed on a single semiconductive substrate. As set forth in FIG. 2, an alternative device 42 may utilize a totally passive substrate 44, such as formed of a planar sheet of glass or the like. Onto such a substrate, is then adhered a conventional MOSFET transistor 46 having the respective doped regions, insulating layers, and metallic contacts, as described hereinabove with respect to the MOSFET of the device 10 and set forth in FIG. 1. Onto an adjacent portion of the substrate 44 is similarly adhered a second portion of the device consisting of a suitable substrate 48 onto which is formed a magnetically activated piezoresistor 50. The piezoresistor 50 is formed by first depositing a piezoresistive film 51. Suitable electrical contacts 52 and 54 are applied to two sides of the film 51. Overlying the region of the film 51 between the contacts is deposited an insulating thin film 56, such as $SiO_2$, and overlying this layer is deposited a thin film 58 of a magnetostrictive material, such as Ni. Appropriate electrical contact is provided to one of the electrodes 52 via lead 60, and from electrode 54 via lead 62 to the gate electrode 64 of the MOSFET transistor 46. The elements formed on substrate 48 thus form one component of the MOSFET gate biasing network which also includes resistor 74 and source of potential 76. Similarly, a suitable source of potential 66 and potential dropping resistor 68 is provided to couple the drain and source contacts 70 and 72, respectively, of the MOSFET transistor 46.

Figure 2:
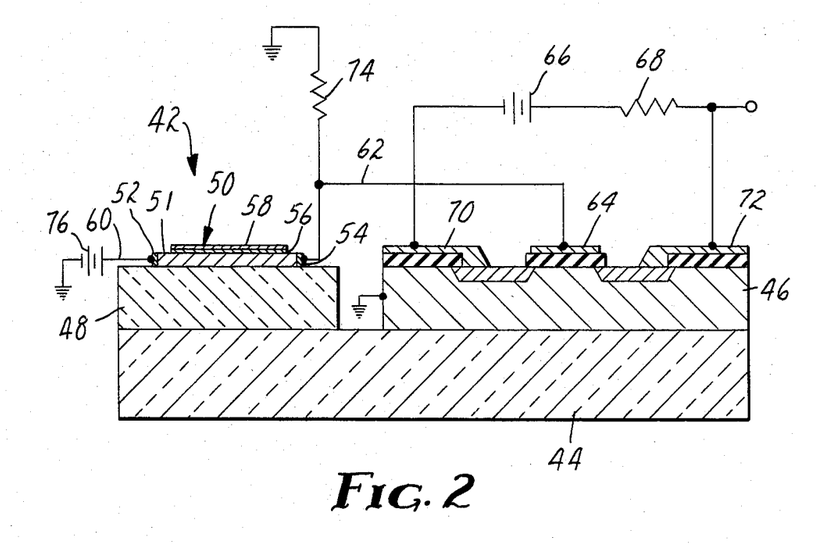
FIG. 2 is a further embodiment of the present invention wherein the magnetostrictive and piezoresistive strata are associated with a substrate separate from the substrate on which an associated solid-state amplifier is formed.
Figures 3A, 3B:
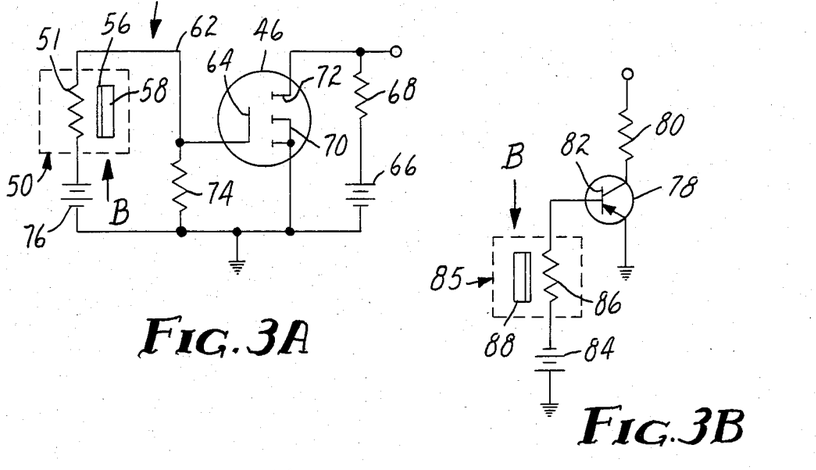
FIG. 3A is an equivalent electrical circuit showing the appropriate biasing potentials utilized with the device of FIG. 2.
FIG. 3B is an equivalent electrical circuit showing the appropriate bias potentials utilized with a magnetically activated piezoresistor interacting with a bipolar solid-state amplifier.

As a further aid in understanding the electrical operation of the devices of the present invention, an electrical equivalent diagram of the device and associated circuit shown in FIG. 2 is set forth in FIG. 3A. As there set forth, the device 42 includes a conventional MOSFET transistor 46, the gate electrode 64 of which is coupled via lead 62 to a biasing circuit consisting of a source of potential 76, a magnetically activated piezoresistor 50, and a conventional resistor 74, respectively. DC voltages are applied to the source and drain, 70 and 72, respectively, via potential source 66 and resistor 68. The AC output of the amplifier is taken from the resistor 68. The value of the resistor 68, typically about 10 k-ohms, is selected to give high amplifier gain for a moderate source-drain supply voltage. Thus, when the device is placed in an external magnetic field, such as shown by the arrow labeled "B", the field will induce a strain in the magnetostrictive film 58, thereby inducing a change in resistance in the piezoresistive film 51, which change modulates the voltage across the resistor 68.

An electrical circuit analogous to that used with the MOSFET based device described in conjunction with FIGS. 2 and 3A, but which employs a bipolar transistor, is shown in FIG. 3B. As there set forth, a pnp transistor 78 is provided with a collector-emitter bias via resistor 80 connected between ground and a source of potential (not shown). The base 82 of the transistor 78 is coupled to a bias network formed of source of potential 84 and the magnetically activated piezoresistor 85. In operation, an external magnetic field applied in the direction shown by arrow "B" induces a strain in the magnetostrictive stratum 88, which in turn causes a resistance change in the piezoresistive element 86 and then results in a change in the base current.

In another embodiment of the present invention, a device functionally equivalent to that described in conjunction with FIG. 3B hereinabove may be constructed by adding suitable high permeability pole pieces to enable remote sensing of localized magnetic fields such as may be present in magnetic recording media. One such device is set forth in plane view in FIG. 4A, and associatedly, in cross-sectional view in FIG. 4B. As there set forth, the device 90 includes a silicon substrate 92 having a region 94 having appreciable piezoresistive characteristics. At opposite ends of the region 94 are deposited electrodes 96 and 98. Overlying the piezoresistive region 94 is a thin film insulator 100 and overlying the insulating thin film 100 is a thin film of a magnetostrictive material 102. Finally, overlying the thus deposited films are two high permeabilty thin film pole pieces 104 and 106, respectively. The magnetostrictive film 102 and adjacent piezoresistive region 94 are thus formed within the gap of the pole pieces 104 and 106. When a perpendicularly recorded bit within a magnetic recording layer 110 and an associated high-permeability underlayer 112 such as would be provided with vertically oriented magnetic recording medium 114, passes under the high permeability leg 104, the flux therefrom is concentrated and channelled up to the gap between the pole pieces 104 and 106. A substantial proportion of the flux will then bridge through the magnetostrictive film 102 across the gap, and the flux loop will close back onto the bit through the large area pole piece 106 and the high permeability underlayer 112. The pole piece 106 is desirably made sufficiently extensive in area to result in a flux density sufficiently low to avoid magnetically affecting recorded data passing adjacent that pole piece. The flux thus induced in the magnetostrictive film 102 will produce an associated electrical output from the piezoresistive region in the manner described in conjunction with FIG. 3B herein above.

Figure 4A:
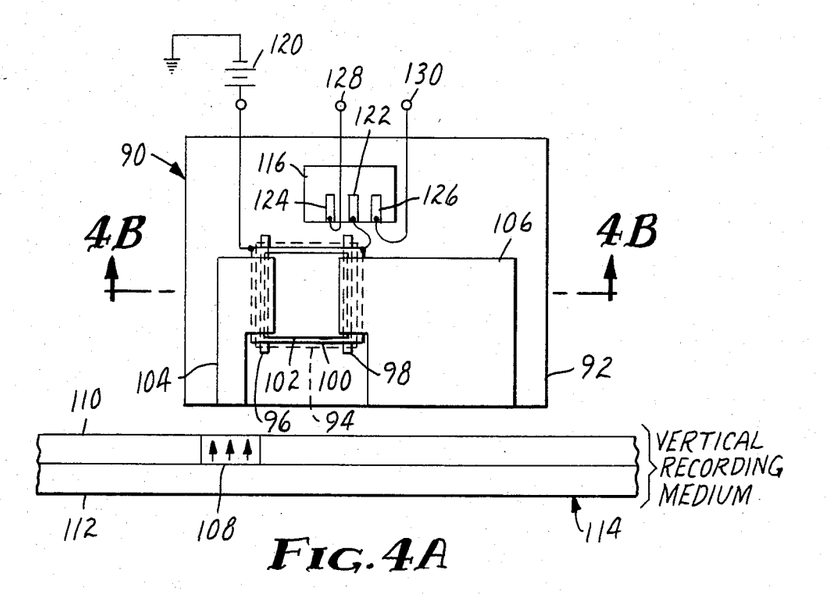
FIG. 4A is a plane view of a further embodiment of the present invention utilizing asymmetric pole pieces to provide a playback head suitable for reproduction of vertical recording.

In the embodiment set forth in FIG. 4A, a conventional bipolar transistor 116 is separately fabricated and bonded to the silicon substrate 92 as there shown. The electrodes 96 and 98 may then be coupled between a source of potential 120 and the base 122 of the transistor 116. Also the collector and emitter 124 and 126, respectively, can be coupled via leads 128 and 130 to an appropriate bias circuit.

Figure 4B:
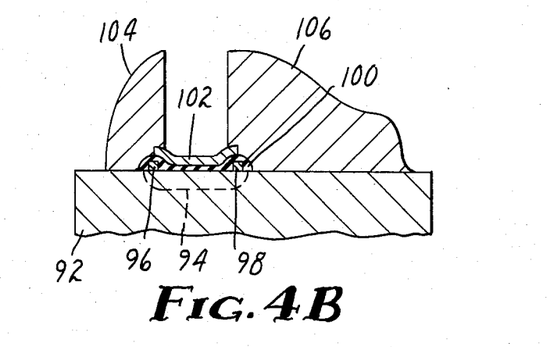
FIG. 4B is a cross-sectional view taken along the lines 4B showing the relationships among the various layers making up the integrated device.

As shown in more detail in the cross-sectional view of FIG. 4B, such a device includes the substrate 92 having a piezoresistive region 94. On top of the region 94 are the metal electrodes 96 and 98, the insulating film 100 and the magnetostrictive film 102, respectively. The high permeability thin film pole pieces 104 and 106 are similarly shown deposited over the magnetostrictive film, leaving the gap region therebetween.

Figure 5:
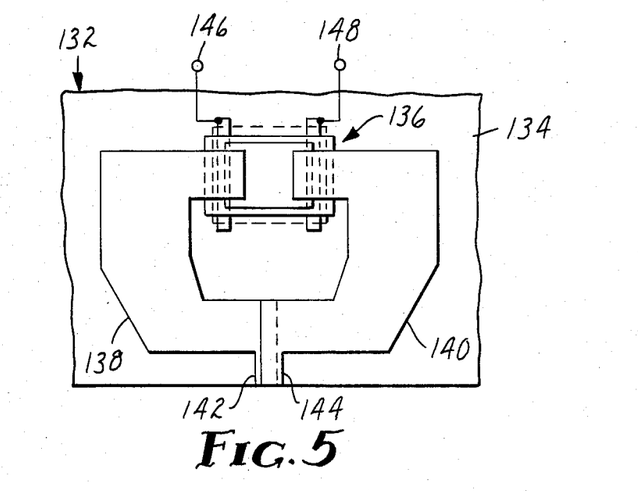
FIG. 5 is a plane view of a further embodiment of the present invention utilizing pole pieces to provide a ring type playback head suitable for playback of either vertical or longitudinal recordings.

An alternative construction providing the capability to read both longitudinally and perpendicularly recorded data is shown in FIG. 5. As there shown, the device 132 includes a silicon substrate 134 onto which is deposited a magnetostrictive-piezoresistive transducer element 136, substantially the same as that shown in detail in FIGS. 4A and 4B. However, unlike the device of FIGS. 4A and 4B, symmetric, thin film pole pieces 138 and 140 are deposited thereover; one pole piece terminates with an underlying pole tip 142 which is substantially covered by a second pole tip 144. The two pole tips are separated by an insulative thin film (not shown), thus forming the working gap of the resultant head. The construction of such thin film heads is well known to those skilled in thin film recording and playback head technology. Leads from the transducer 136 may then be coupled via leads 146 and 148 to a transistor (not shown) in the same manner as set forth in FIG. 4A.

Figure 6A:
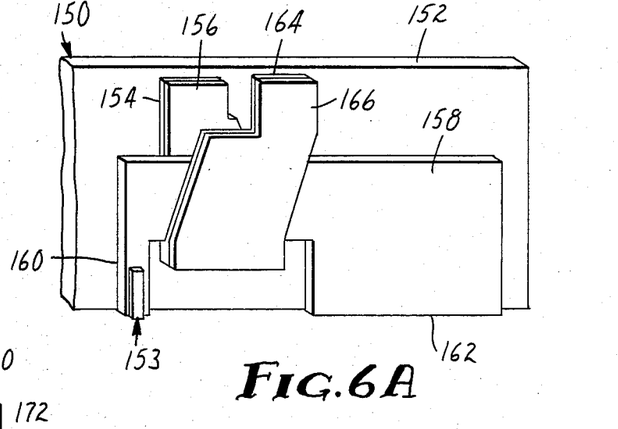
FIG. 6A is a plane view of a further embodiment of the present invention utilizing asymmetric pole pieces as shown in FIG. 4A, and wherein a single-turn inductive write head is further included to provide both write and read capabilities.

In an embodiment similar in many respects to that set forth in FIGS. 4A, 4B and 5, the present invention may also be utilized with external pole pieces to provide both a read and write capability. As set forth in FIG. 6A, such a device 150 may include a silicon substrate 152 on which are deposited successive thin films so as to form a single turn inductive winding around the appropriate pole pieces together with a magnetostrictive-piezoresistive transducer assembly 153. Thus, using appropriately configured masks, there may first be deposited upon the substrate 152, one half of an inductive winding 154 in the form of a thin film of a highly conductive material such as aluminum, copper or silver. On top of the half winding 154 may then be deposited an insulating film 156, which film is substantially the same configuration as that of the half winding 154, except that it is terminated to allow the winding half to be exposed along its lower portion. A thin film of a high permeability material may next be deposited as layer 158, thereby forming a concentrated pole piece 160 and a distributed pole piece 162, the insulating film 156 preventing the major portion of the winding half from shorting out to the high permeability layer 158. On top the high permeability layer 158 is then deposited the second half of the inductive single turn winding comprising an insulating film 164 and a conductive film 166. As in the case of the insulating film 156, the second insulating film 164 is likewise terminated along the lower portion to allow the conductive film 166 to directly contact the first winding half 154, thereby completing a single turn around the high permeability film 158.

Figure 6B:
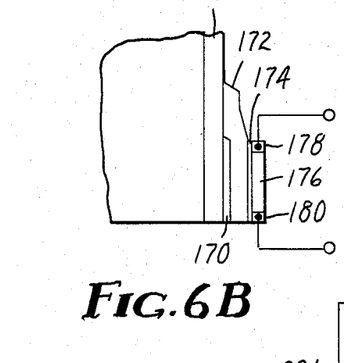
FIG. 6B is a cross-sectional view of the respective layers included within the structure shown in FIG. 6A.

Onto such a conventional thin film write head, such as is particularly adapted for recording onto perpendicularly oriented magnetic recording media, may then be deposited appropriate films to provide the magnetostrictive-piezoresistive transducer 153, which transducer is shown in more detail in FIG. 6B. Again, using appropriate masks, there may be first deposited upon the pole tip 160 a thin insulating film 170, thereby spacing subsequent layers from the pole tip 160, and providing an effective magnetic working gap. On top of the spacer film 170 may be deposited a thin film of magnetostrictive material 172, which surrounds the spacer layer 170 and extends into direct contact with the pole tip 160 so as to complete a magnetic circuit therewith. An insulative film 174 may next be deposited onto the magnetostrictive film 172, and a piezoresistive film 176 applied thereover. Appropriate electrical contacts 178 and 180 may then be deposited onto opposite sides of the piezoresistive film 176.

Such a configured head may thus be utilized in a write mode by applying suitable currents to the inductive winding formed by the conductive films 154 and 166 in order to induce an appropriate magnetic field in the core 158, and thereby provide a concentrated field within the pole piece 160 so as to induce localized magnetic fields within a magnetic recording medium positioned therebelow. In a playback mode, such localized fields will cause a strain to be induced within the magnetostrictive layer 172, a flux return path for such fields thereupon being provided via the pole piece 160. The strain induced within the magnetostrictive film 172 is coupled to the piezoresistive film 176 to modify the resistance thereof, thereby modulating the input to an associated amplifier (not shown) as discussed hereinabove.

Figure 7:
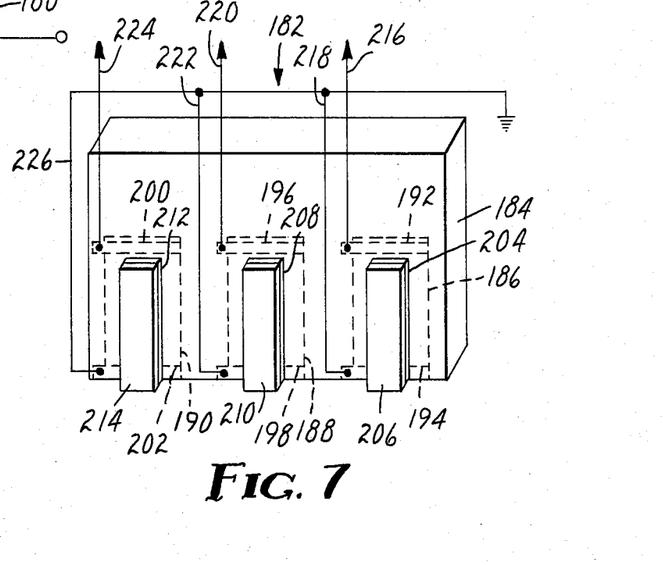
FIG. 7 is a perspective view of a further embodiment of the present invention wherein a plurality of magnetostrictive-piezoresistive sensing elements are used in combination to provide a multi-channel playback head.

FIG. 7 sets forth in perspective view a further preferred embodiment of the present invention wherein a plurality of magnetostrictive-piezoresistive sensing elements are provided, thus enabling simultaneous playback of parallel tracks. Alternatively, such a device may also be used to maintain the head positioned over a single track via a dynamic servoing system. As there set forth, such a head 182 may include a silicon substrate 184 into which is diffused a plurality of piezoresistively responsive regions 186, 188 and 190, into the ends of which are formed highly conductive regions 192 and 194, 196 and 198, and 200 and 202, respectively. As desired, several discrete insulating films and overlying magnetostrictive films 204 and 206, 208 and 210, and 212 and 214, respectively, may then be deposited onto the piezoresistive regions. Separate contacts may then be provided to the highly conductive regions via leads 216 and 218, 220 and 222, and 224 and 226 respectively, thus coupling each discrete sensor to an appropriate amplifier (not shown). In the device there set forth, it will be recognized that strain, separately induced in any one of the magnetostrictive elements 206, 210, and 214, respectively, will induce a localized strain in the piezoresistive region proximate the particular strained magnetostrictive element, thereby modulating an electrical signal applied to the respective leads. While, in the embodiment there shown, a single substrate having a plurality of discrete piezoresistive regions has been utilized, separate piezoresistive strata matching the magnetostrictive strata may likewise be used.

Due to the close proximity of the three piezoresistive elements, a certain amount of "crosstalk" may occur between them, particularly if the magnetostrictive elements produce strain over regions larger than that physically covered by each discrete piezoresistive region. Consequently, in such an application, a certain amount of mechanical isolation between the respective piezoresistive regions may be desirable.

In certain magnetic sensing situations, a small magnetic signal must be detected in the presence of noise that is both time varying and/or steady state. A further difficulty sometimes encountered is that various piezoresistive materials are not only pressure-sensitive, but are sensitive to undesired stimuli such as temperature as well. In addition, non-magnetically induced strains can also couple unwanted signals via the piezoresistive film.

Figure 8:
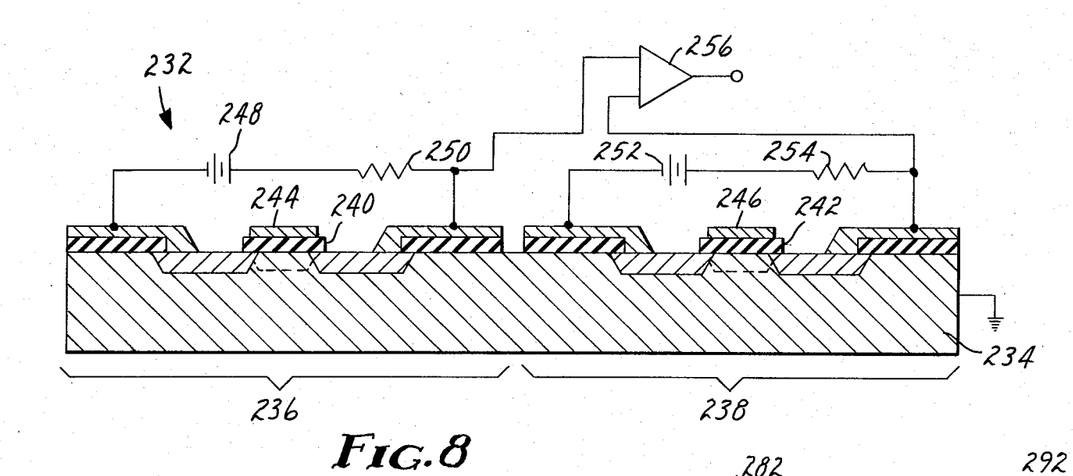
FIG. 8 is a combined cross-sectional view and electrical schematic of a further embodiment of the present invention incorporating a single substrate having dual MOSFET amplifiers thereon, each of which has a piezoresistively responsive channel, and in which a magnetostrictive stratum is proximate one of the gates while a non-magnetostrictive stratum is proximate the other gate so as to provide common mode noise rejection.

FIG. 8 sets forth a preferred embodiment of the present invention wherein additional components are provided for suppressing unwanted effects of stimuli other than the main magnetic signals of interest. In such an embodiment, a pair of sensing elements as nearly geometrically identical as possible are provided, with only one of the sensing elements receiving the stimuli of interest, but with both the sensing elements equally receiving all background stimuli. Accordingly, the device set forth in FIG. 8 incorporates a common mode noise rejection feature. As there shown, the device 232 includes a common substrate 234 within which are fabricated two separate MOSFET transistors each shown generally extending over two separate regions 236 and 238, respectively, of the substrate. Each of the MOSFET transistors are conventional in nature so far as having the requisite doped regions, metal oxide layers and source, gate, and drain electrodes, but further modified to have piezoresistively responsive channels. Further, as shown in FIG. 8, the common mode noise rejection capability is provided by depositing over the respective gate regions 240 and 242 a magnetostrictive film 244 and a similarly configured non-magnetostrictive film 246, such as may be provided by a thin film of aluminum, or the like. Contacts (not shown) to each of the respective films 244 and 246 may be provided to allow applications of appropriate bias potentials. Appropriate sources of potential and biasing resistors, 248 and 250, and 252 and 254, respectively, will also be provided for energization of the two separate MOSFET sections. The output from the two respective MOSFET sections will then typically be coupled to a differential amplifier 256 to provide an appropriate differential output signal.

In an alternative embodiment, common mode noise rejection may be obtained even though both the films 244 and 246 are magnetostrictive in nature. In such an embodiment, only one of the films would be exposed to the desired magnetic field, with appropriate shielding provided if desired to minimize cross-talk. Hence, the difference between the outputs of the two would represent a magnetically induced signal with common node noise rejected.

Figure 9:
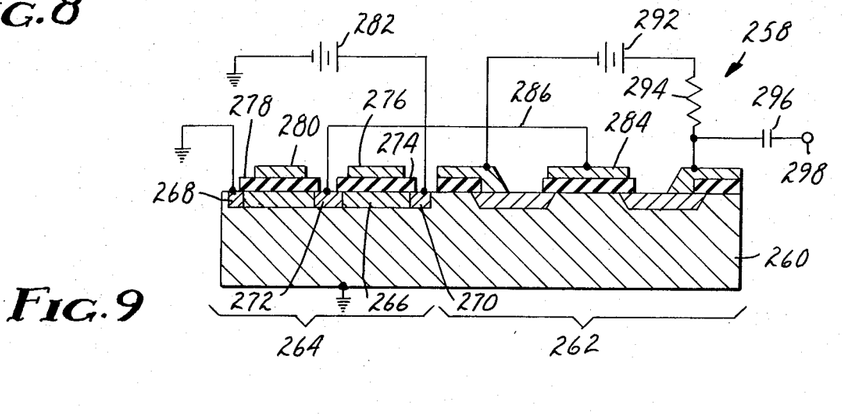
FIG. 9 is a combined cross-sectional view and schematic of a further embodiment for providing common mode noise rejection utilizing a single transistor.

In another alternative construction, common mode nose rejection may similarly be achieved using a single MOSFET device. Thus, for example, as shown in FIG. 9, such a device 258 can be fabricated using a single silicon substrate 260, upon a first portion 262 of which is fabricated a conventional MOSFET transistor. Within the same substrate but within region 264, a single piezoresistive zone 266 is then formed, having highly conductive regions 268 and 270, respectively, at each end. A third conductive portion 272 is also provided in the center of the zone 266, thus dividing the zone into 2 halves of equal resistance. Overlying one half of the piezoresistive zone 266 is an insulating layer 274 on top of which is a magnetostrictive layer 276. Analogously, overlying the other half of the zone 266 is another insulating layer 278 and a non-magnetostrictive layer 280. The two piezoresistors thus formed, in combination with a source of potential 282, constitute a biasing network for the gate 284 of the MOSFET via the lead 286. Application of an external magnetic field thus modulates the resistance of the zone underlying the magnetostrictive layer 276, and results in a change in the bias potential applied to the gate 284. Also shown in FIG. 9 is a source of potential 292, bias resistor 294 and coupling capacitor 296 for providing an output signal at terminal 298.

Figure 10:
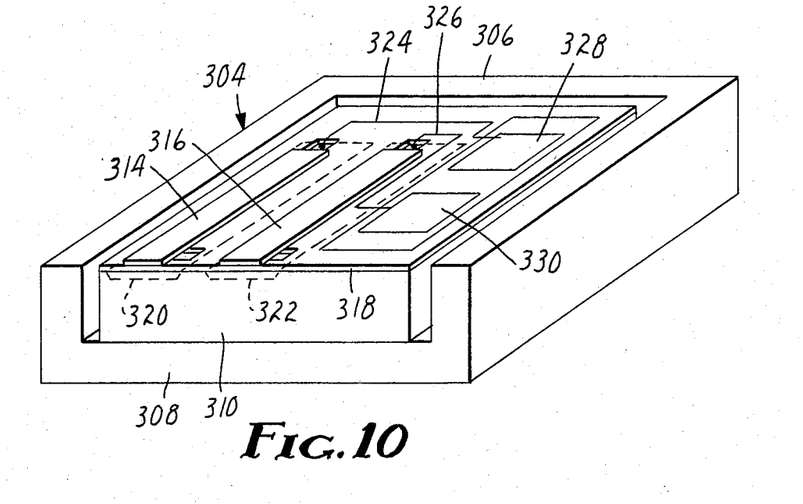
FIG. 10 is a perspective view of the present invention utilizing both magnetostrictive and non-magnetostrictive films, thereby providing common mode noise rejection such as shown in FIG. 8, wherein the device is assembled in a conventional integrated circuit chip carrier to facilitate further mounting.

A desirable arrangement for mounting the devices of the present invention is set forth in the perspective view of FIG. 10. As there set forth, one such device 304 includes a conventional ceramic chip carrier 306 which is arranged to have an internal recess and to be open at one end 308. Such chip carriers typically have a plurality of bonding pads positioned about their periphery for enabling electrical connections to be made to the various portions of a semiconductor substrate positioned therein. Thus, as set forth in FIG. 10, a silicon substrate 310 is mounted within the carrier 306 using an appropriate thermally conductive adhesive, with one end of the substrate terminating substantially coincident with the open end of the carrier 308. In order to provide a common mode noise rejection configuration like that set forth in FIG. 8, a magnetostrictive film 314 and a non-magnetostrictive film 316 are deposited over an insulating film 318 covering separate piezoresistive zones 320 and 322. The magnetostrictive film is a thin film of an iron-silicon alloy having the approximate composition $Fe_{70}Si_{30}$ with a thickness in the range of 200-800 nanometers. The non-magnetostrictive film 316 may be a sputtered film of aluminum having a thickness of approximately 300 to 500 nanometers, and of similar physical dimensions. As shown schematically by leads 324 and 236, respectively, the differently fabricated piezoresistors may be coupled to the electrodes of integrated transistors 328 and 330, bonded to another portion of the substrate 310 via a suitable thermally conductive adhesive, or fabricated as an integral portion thereof. In a typical case, the periphery of the chip carrier 306 will include bonding pads (not shown) so that connections to appropriate biasing potentials and input and/or output signals may be made to the transistors.

Figure 11:
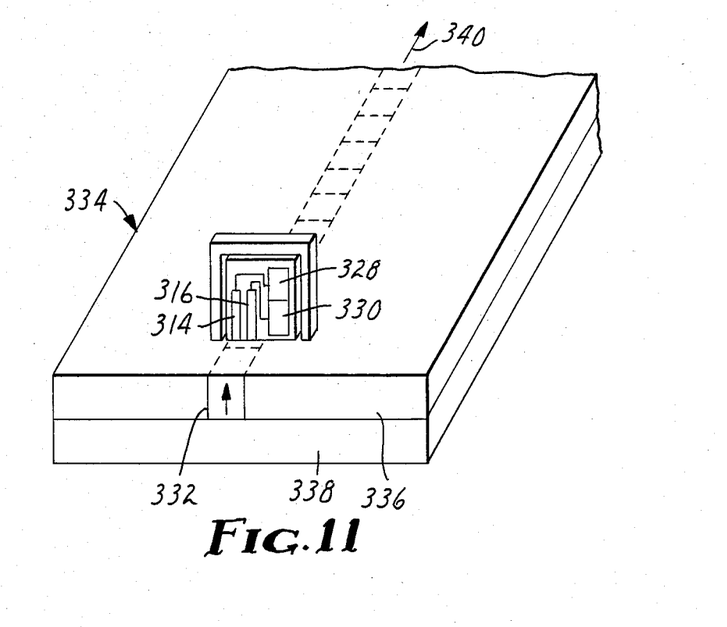
FIG. 11 is a perspective view showing the chip carrier mounted device of FIG. 10 positioned adjacent a magnetic recording medium.

As shown in FIG. 11, a chip carrier such as described in the foregoing, having the respective films terminating proximate the open end of the carrier, may be utilized to detect perpendicularly encoded localized magnetic filed patterns 332 within a magnetic recording medium 334. Such a medium may include a layer of a vertically oriented magnetic recording material 336 over a high permeability substrate 338, which thereby provides an efficient flux return path. As a localized bit 332 thus comes proximate the magnetostrictive and metallic films 314 and 316, respectively, differential strain will be induced within the magnetostrictive film 314 to provide an appropriate signal from the transistors 328 and 330 as the medium 334 is caused to move in the direction of the arrow 340.

As described herein, the amplifier which desirably forms an integrated part of the device of the present invention may be a MOSFET, JFET or bipolar type transistor and thus provides the first stage of amplification as well as impedance matching, to the magnetostrictive-piezoresistive portion of the device. In any event, the transistors desirably used in the present devices can be fabricated by standard IC processes. In such possible configurations, the device of the present invention can be fabricated with MOSFET amplifiers employing either N-type or P-type channels, operating in either the enhancement or depletion mode.

Finally, with respect to the magnetostrictive stratum, such a layer is desirably deposited in intimate mechanical contact with the piezoresistive stratum. A number of materials may be used as magnetostrictive elements. Among these are various compositions of FeSi, FeB, Ni, FeSiTb, FeNi, etc. Optimum thicknesses and application techniques will depend upon the particular material selected. There are a variety of techniques available to provide for coupling between the magnetostrictive and piezoresistive strata. The magnetostrictive material may be sputtered, evaporated, plated, or even adhered with, for example, a thin epoxy layer over the piezoresistive material. Of course, the mechanical and electrical characteristics of the device will depend on the particular deposition or application method employed.

It is the magnetostrictive film that actually couples to a magnetic field. Consequently, its properties are perhaps the most critical to device performance. The basic material characteristics required are relatively low coercivity, so that the film magnetization can be easily switched, and a relatively high magnetostriction coefficient. The particular properties of the magnetostrictive layer can be tailored somewhat to match the properties of the piezoresistive stratum and amplifier being used. However, in general it is desirable to have the highest possible induced strain per unit applied field, consistent with achieving magnetic saturation in digital applications at an acceptably low field intensity. The physical dimensions of the film determined the spatial field resolution and bandwidth of the sensor. Thin film, photolithographically patterned elements can achieve maximum bandwidth and resolution.

While various specific constructions and circuit configurations have been set forth in conjunction with the figures discussed herein, it will be readily apparent to those skilled in the art that many variations and alternatives are feasible. Thus as examples, the various circuit connections, grounds, etc., may be inverted, off set by suitable D.C. potentials, or equivalent amplifiers and the like provided. Likewise, the various constructional configurations may be inverted, additional films included, alternative pole piece geometries substituted, etc. Also wide variations in the thickness and other dimensions of the respective films utilized in the device can be employed depending upon the specifications desired.

We claim:

1. A magnetic sensor comprising
   a magnetostrictive stratum
   a piezoresistive stratum coupled to the magnetostrictive stratum enabling strain magnetically induced in the magnetostrictive stratum to produce in said piezoresistive stratum a corresponding change in the electrical resistivity thereof, and
   means for sensing said change in resistivity and for supplying an electrical output signal solely in response thereto which is representative of the intensity of magnetic fields impressed upon said magnetostrictive stratum and which is directly coupled to said piezoresistive stratum to monitor the change in resistivity.

2. A sensor according to claim 1, wherein said piezoresistive stratum is within a substrate and wherein said magnetostrictive stratum overlies said substrate.

3. A magnetic sensor according to claim 1, wherein said sensing means comprises a solid state amplifier formed as a single integrated structure together with said piezoresistive stratum.

4. A magnetic sensor according to claim 3, wherein said solid-state amplifier includes a piezoresistively responsive region mechanically coupled to said magnetostrictive stratum.

5. A magnetic sensor according to claim 4, wherein said solid state amplifier comprises a MOSFET type amplifier having a channel region to which said magnetostrictive stratum is mechanically coupled.

6. A magnetic sensor according to claim 1, wherein said magnetostrictive stratum exhibits electrical conductivity, further comprising an insulative stratum between said magnetostrictive stratum and said piezoresistive stratum.

7. A magnetic sensor according to claim 1, further comprising another stratum having substantially the same area as said magnetostrictive stratum and coupled to a second piezoresistive stratum enabling stimuli applied in the region of said another stratum and coupled to said second piezoresistive stratum to produce therein a corresponding change in electrical resistivity, and
   means for sensing changes in the electrical resistivity in said second piezoresistive stratum and for supplying a second output signal in response thereto which is representative of stimuli applied in the region of said another stratum,
   whereby stimuli applied to both piezoresistive strata may be suppressed in said sensing means operating in a differential mode, while allowing stimuli coupled to only one of said piezoresistive strata to be readily detected.

8. A sensor according to claim 7, wherein said another stratum comprises a material having substantially no magnetostrictive characteristics, thereby enabling undesired non-magnetic stimuli, both time-varying and steady state, applied to both said piezoresistive strata to be suppressed while magnetic stimuli present only in the first piezoresistive stratum are readily detected.

9. A sensor according to claim 1, wherein said magnetostrictive stratum comprises a material selected from the group consisting of nickel and alloys of iron with nickel, boron, silicon, or terbium.

10. A sensor according to claim 1 adapted for use as a playback head for magnetic recording media, wherein said magnetostrictive stratum comprises a thin film of a magnetostrictive material applied to a semiconductive substrate having a piezoresistive stratum therein and further comprising means for coupling magnetic flux derived from a magnetic recording medium to said magnetostrictive stratum.

11. A sensor according to claim 10, wherein said sensor further comprises carrier means for supporting a substrate having appreciable piezoresistive characteristics and a thin film of a magnetostrictive material thereon, said carrier means being open at one end and having said substrate and said magnetostrictive thin film terminating substantially coplanar with said open end, and wherein said carrier means and elements supported therein are adapted to be mounted with the plane of said thin film substantially normal to the surface of a magnetic recording medium, thereby enabling localized magnetic patterns in said medium and oriented normal to the surface thereof to be impressed on the length of the magnetostrictive thin film extending away from said recording medium surface to thereby impart a lengthwise strain which is coupled to said piezoresistive substrate.

12. A sensor according to claim 11, wherein said flux coupling means includes at least one pole piece comprising a thin film of a high permeability material supported by said carrier means and terminating substantially coplanar with said open end such that the plane of said pole piece may be mounted substantially normal to the plane of a magnetic recording medium, thereby enabling magnetic fields associated with localized magnetic patterns in said medium to be coupled to said pole piece, and wherein said magnetostrictive thin film is positioned within said carrier means and is magnetically coupled to said pole piece to thereby impress said coupled magnetic fields onto said magnetostrictive thin film.

13. A sensor according to claim 12, wherein said pole piece terminates within said carrier means to define one boundary of a back gap, and wherein a second thin film of a high permeability material of appeciably larger area is supported by said carrier means, one portion of which terminates within said carrier means to define another boundary of said back gap and a second portion having an extended width terminates substantially coplanar with said open end to distribute said coupled magnetic fields back to said medium, and wherein said magnetostrictive thin film is positioned within said carrier means and substantially across said back gap defined by said pole pieces to thereby impress said coupled magnetic fields onto said magnetostrictive thin film.

14. A sensor according to claim 12, further comprising an inductive thin film winding having at least one turn encompassing said pole piece, thereby allowing write currents to be applied to said winding to generate magnetic fields proximate to said pole piece sufficient to record corresponding field patterns onto a magnetic record medium positioned proximate thereto.

15. A sensor according to claim 10 wherein said flux coupling means includes at least two substantially coplanar pole pieces comprising thin films of high permeability material supported by said carrier means and having mutual boundaries defining a working gap and a back gap and terminating substantially coplanar with said open end such that the plane of said thin film pole pieces may be mounted substantially normal to the plane of a magnetic recording medium to have said working gap extending parallel to the surface of said medium, thereby enabling magnetic fields associated with localized patterns in said medium to be coupled via said working gap to said pole pieces, and wherein said magnetostrictive thin film is positioned within said carrier means and substantially across said back gap defined by said pole pieces to thereby impress said coupled magnetic fields onto said magnetostrictive thin film.

16. A sensor according to claim 15, further comprising at least a one-turn inductive thin film winding encompassing at least one of said pole pieces, thereby allowing write currents to be applied to said winding to generate magnetic fields proximate to said working gap sufficient to record corresponding field patterns into a magnetic record medium positioned proximate thereto.

17. A sensor according to claim 10, further comprising a plurality of magnetostrictive thin films with strain magnetically induced in a given magnetostrictive thin film being coupled to a piezoresistive stratum adjacent thereto to result in a change in the electrical resistance in said adjacent piezoresistive stratum such that multiple parallel tracks in a record medium may be detected, and/or said head may be dynamically centered on a single track of sufficient width to encompass at least three magnetostrictive films, and any deviation of the head being detectable as a change in the balance of signals detected by the outermost magnetostrictive films to thereby activate a transverse head position servo mechanism.

18. A sensor according to claim 10, wherein said semiconductive substrate comprises a single crystal having either n or p type characteristics and including at least one region of opposite conductivity type over which said thin film of magnetostrictive material is applied, such that an electrical potential applied to said region results in a current flow localized within the region covered by said magnetostrictive thin film.

19. A sensor according to claim 18 wherein said semiconductive substrate includes at least two electrically isolated regions of said opposite conductivity type, said magnetostrictive thin film overlying one of said regions, and wherein said sensing means comprises means for differentially detecting electrical resistance changes in the two portions of said piezoresistive stratum, whereby undesired stimuli, both time-varying and steady state, applied to both portions of said piezoresistive stratum may be suppressed, while allowing stimuli present in only one portion thereof to be readily detected.

20. A sensor according to claim 19, further comprising another stratum of a non-strain sensitive electrically conductive material having substantially the same area as said magnetostrictive stratum and extending over another of said electrically isolated regions of said piezoresistive stratum.

21. A sensor according to claim 20, wherein said sensing means further comprises a fixed source of potential coupled to a voltage divider comprising the portion of piezoresistive stratum underlying the magnetostrictive stratum in series with the portions of the piezoresistive stratum underlying the non-strain sensitive stratum and having an electrical connection therebetween connected to a solid state amplifier.

* * * * *